US012119311B2

(12) United States Patent
Miyazawa (10) Patent No.: US 12,119,311 B2
(45) Date of Patent: Oct. 15, 2024

(54) AMPLIFIER DEVICE

(71) Applicant: SUMITOMO ELECTRIC DEVICE INNOVATIONS, INC., Kanagawa (JP)

(72) Inventor: Naoyuki Miyazawa, Yokohama (JP)

(73) Assignee: SUMITOMO ELECTRIC DEVICE INNOVATIONS, INC., Kanagawa (JP)

(*) Notice: Subject to any disclaimer, the term of this patent is extended or adjusted under 35 U.S.C. 154(b) by 514 days.

(21) Appl. No.: 17/614,184

(22) PCT Filed: May 25, 2020

(86) PCT No.: PCT/JP2020/020590
§ 371 (c)(1),
(2) Date: Nov. 24, 2021

(87) PCT Pub. No.: WO2020/241586
PCT Pub. Date: Dec. 3, 2020

(65) Prior Publication Data
US 2022/0254743 A1  Aug. 11, 2022

(30) Foreign Application Priority Data
May 27, 2019 (JP) .................................. 2019-098593

(51) Int. Cl.
*H03F 1/42* (2006.01)
*H01L 23/66* (2006.01)
*H03F 3/195* (2006.01)

(52) U.S. Cl.
CPC ............. *H01L 23/66* (2013.01); *H03F 1/42* (2013.01); *H03F 3/195* (2013.01); *H01L 2223/6611* (2013.01); *H01L 2223/6655* (2013.01)

(58) Field of Classification Search
CPC ............. H01L 23/66; H01L 2223/6611; H01L 2223/6655; H01L 23/64; H01L 25/16;
(Continued)

(56) References Cited

U.S. PATENT DOCUMENTS 5,160,984 A    11/1992  Mochizuki
9,331,642 B2 *  5/2016  Musa ...................... H01L 23/66
(Continued)

FOREIGN PATENT DOCUMENTS

JP    H2-246405    10/1990
JP    H5-315865    11/1993
(Continued)

*Primary Examiner* — Hieu P Nguyen
(74) *Attorney, Agent, or Firm* — Smith, Gambrell & Russell, LLP (57) ABSTRACT

Provided is an amplifier device including a semiconductor chip, a package, a first feedback circuit, and a second feedback circuit. The package includes a metal base, an insulating side wall, an input lead, and an output lead. The input lead is connected to a gate pad group of the semiconductor chip. The output lead is connected to a drain pad group of the semiconductor chip. Each of the feedback circuits includes a dielectric substrate disposed on the metal base, a feedback resistor located on the dielectric substrate, and a capacitor connected in series to the feedback resistor. Each of the feedback circuits is connected between the gate pad group and the drain pad group. The feedback circuits are located respectively on the base on one side and the other side of the semiconductor chip in an extension direction of a first and a second end edge.

14 Claims, 6 Drawing Sheets

(58) Field of Classification Search
CPC ... H01L 2223/6644; H01L 25/18; H03F 1/42; H03F 3/195; H03F 2200/147; H03F 1/34; H03F 2200/451; H03F 3/193; H03F 3/60
USPC ........................................ 330/277, 307, 291
See application file for complete search history.

(56) References Cited

U.S. PATENT DOCUMENTS

| | | |
|---|---|---|
| 2004/0145034 A1 | 7/2004 | Fujioka |
| 2009/0231042 A1 | 9/2009 | Jia |
| 2015/0035066 A1 | 2/2015 | Otsuka |
| 2015/0381122 A1 | 12/2015 | Musa |

FOREIGN PATENT DOCUMENTS

| | | |
|---|---|---|
| JP | H6-037559 | 2/1994 |
| JP | H8-032376 | 2/1996 |
| JP | 2003-243942 | 8/2003 |
| JP | 2004-228989 | 8/2004 |
| JP | 2008-526044 | 7/2008 |
| JP | 2014-502797 | 2/2014 |
| WO | 2006/071577 | 7/2006 |
| WO | 2012/078346 | 6/2012 |
| WO | 2013/160962 | 10/2013 |

* cited by examiner

AMPLIFIER DEVICE

TECHNICAL FIELD

The present disclosure relates to an amplifier device.

This application claims the benefit of priority based on Japanese Patent Application No. 2019-098593, filed on 27 May 2019, the entire contents disclosed in the application is incorporated herein by reference.

BACKGROUND ART

Patent Literature 1 describes a technology relating to a wideband amplifier. This wideband amplifier includes a transistor for signal amplification. A matching circuit formed of an inductance and a matching circuit formed of a capacitor are connected to the input side and the output side, respectively, of the transistor for signal amplification. Further, a parallel feedback circuit including a resistor and a capacitor is connected between a dividing point of the divided input matching circuit and a dividing point of the divided output matching circuit. The wideband amplifier disclosed in Patent Literature 1 is intended to reduce a decrease in a gain in a high frequency region and to widen a frequency band as an amplifier by providing such a configuration.

Patent Literature 2 describes a technique relating to a microwave amplifier. This microwave amplifier includes an amplification element with an input terminal and an output terminal, and a feedback circuit which feeds back some of an output output to the output terminal side of the amplification element to the input terminal side of the amplification element. The feedback circuit is formed to pass above or below a surface on which the amplification element is located. Alternatively, the feedback circuit is formed to pass through an inner region sandwiched between two grounding locations at which grounding terminals of the amplification element are grounded. The microwave amplifier described in Patent Literature 2 is intended to shorten a length of the feedback circuit and to improve characteristics.

CITATION LIST

Patent Literature

[Patent Literature 1] Japanese Unexamined Patent Publication No. H5-315865
[Patent Literature 2] Japanese Unexamined Patent Publication No. H6-037559

SUMMARY OF INVENTION

An amplifier device according to the present disclosure includes a semiconductor chip, a package, a first feedback circuit, and a second feedback circuit. The semiconductor chip includes a semiconductor substrate, a plurality of transistors, a gate pad group, a drain pad group, and a source pad group. The semiconductor substrate has first and second end edges which face each other. Each of the transistors has a source electrode, a gate electrode, and a drain electrode on the semiconductor substrate. The gate pad group includes a plurality of gate pads, and the plurality of gate pads are disposed on the semiconductor substrate along the first end edge and connected to the respective gate electrodes of the plurality of transistors. The drain pad group includes a plurality of drain pads, and the plurality of drain pads are disposed on the semiconductor substrate along the second end edge and are connected to the respective drain electrodes of the plurality of transistors. The source pad group includes a plurality of source pads, and the plurality of source pads are connected to the respective source electrodes of the plurality of transistors. The package includes a metal base to which a bottom surface of the semiconductor chip is bonded, an insulating side wall which surrounds the semiconductor chip, an input lead which is connected to the gate pad group and extends from the inside to the outside of the side wall, and an output lead which is connected to the drain pad group and extends from the inside to the outside of the side wall. Each of the first and second feedback circuits includes a dielectric substrate provided on the metal base, a feedback resistor disposed on the dielectric substrate, and a capacitor connected to the feedback resistor in series. The first and second feedback circuits are electrically connected between the gate pad group and the drain pad group. The first feedback circuit is disposed on the base on one side of the semiconductor chip in an extension direction of the first and second end edges. The second feedback circuit is disposed on the base on another side of the semiconductor chip in the extension direction.

DESCRIPTION OF EMBODIMENTS

Problems to be Solved by the Present Disclosure

In recent years, there has been a demand for a semiconductor amplifier device capable of responding to a high frequency and a wide band. The wide band referred to here is, for example, a frequency band which covers from a low frequency (LF) band of several tens of kHz to several hundreds of kHz to a radio frequency (RF) band of several GHz. As a method for improving amplification characteristics of a transistor in such a wide frequency band, there is a method in which feedback is performed from a drain to a gate of a transistor (for example, refer to Patent Literatures 1 and 2). Since a phase of a signal differs by 180° between the gate and the drain of the transistor, the circuit in which the feedback is performed from the drain to the gate is a negative feedback circuit. Then, due to a law of a constant gain bandwidth product (GB product), the band is expanded by an amount that the gain is reduced. The feedback circuit is configured of, for example, a series circuit of a resistor and a capacitor.

On the other hand, in recent high-frequency transistors, the ability to respond to a larger current is desired. Therefore, the sizes of the transistors are gradually increasing, and for example, those having a large number of gate fingers such as several tens are being put into practical use. In a transistor having such a large size, a wiring path of the feedback circuit which connects the gate to the drain becomes long, and inductance of a wiring induces disturbance of frequency characteristics of the transistor.

Therefore, an object of the present disclosure is to provide an amplifier device capable of shortening a wiring path of a feedback circuit and curbing disturbance of frequency characteristics of a transistor.

Effects of the Present Disclosure

According to the present disclosure, it is possible to provide an amplifier device capable of shortening a wiring path of a feedback circuit and curbing disturbance of frequency characteristics of a transistor.

Explanation of Embodiments of the Present Disclosure

First, embodiments of the present disclosure will be listed and described. An amplifier device according to one embodiment includes a semiconductor chip, a package, a first feedback circuit, and a second feedback circuit. The semiconductor chip includes a semiconductor substrate, a plurality of transistors, a gate pad group, a drain pad group, and a source pad group. The semiconductor substrate has first and second end edges which face each other. Each of the transistors has a source electrode, a gate electrode, and a drain electrode on the semiconductor substrate. The gate pad group includes a plurality of gate pads, and the plurality of gate pads are disposed on the semiconductor substrate along the first end edge and connected to the respective gate electrodes of the plurality of transistors. The drain pad group includes a plurality of drain pads, and the plurality of drain pads are disposed on the semiconductor substrate along the second end edge and are connected to the respective drain electrodes of the plurality of transistors. The source pad group includes a plurality of source pads, and the plurality of source pads are connected to the respective source electrodes of the plurality of transistors. The package includes a metal base to which a bottom surface of the semiconductor chip is bonded, an insulating side wall which surrounds the semiconductor chip, an input lead which is connected to the gate pad group and extends from the inside to the outside of the side wall, and an output lead which is connected to the drain pad group and extends from the inside to the outside of the side wall. Each of the first and second feedback circuits includes a dielectric substrate provided on the metal base, a feedback resistor disposed on the dielectric substrate, and a capacitor connected to the feedback resistor in series. The first and second feedback circuits are electrically connected between the gate pad group and the drain pad group. The first feedback circuit is disposed on the base on one side of the semiconductor chip in an extension direction of the first and second end edges. The second feedback circuit is disposed on the base on another side of the semiconductor chip in the extension direction.

In the above-described amplifier device, the first and second feedback circuits are provided along with the semiconductor chip on the base on which the semiconductor chip is mounted in the package. Therefore, it is possible to shorten the wiring path of the feedback circuit as compared with a case in which the feedback circuit is provided outside the package, for example. Therefore, according to this amplifier device, it is possible to effectively curb the disturbance of the frequency characteristics of each of the transistors included in the semiconductor chip. Further, in the amplifier device, at least two feedback circuits are provided, the first feedback circuit is provided on one side of the semiconductor chip in the extension direction of the first and second end edges of the semiconductor substrate, and the second feedback circuit is provided on another side of the semiconductor chip in the extension direction. In this case, compared with a case in which the feedback circuit is provided on only one side of the semiconductor chip, it is possible to reduce a characteristic variation caused by a variation in a distance from each of the gate pads and each of the drain pads to the feedback circuit.

In the above-described amplifier device, a resistance value of the feedback resistor of the first feedback circuit and a resistance value of the feedback resistor of the second feedback circuit may be equal to each other. In this case, uniform characteristics can be given to the first and second feedback circuits, and the disturbance of the frequency characteristics of each of the transistors included in the semiconductor chip can be more effectively curbed.

In the above-described amplifier device, capacitors of the first and second feedback circuits may be die capacitors provided on the output leads. In this case, the capacitors can be easily disposed in a narrow package.

In the above-described amplifier device, the dielectric substrate is fixed to the base via a metal-containing adhesive, and the first and second feedback circuits may include an input-side capacitor as the above-described capacitor electrically connected between the gate pad group and the feedback resistor, and an output-side capacitor as the above-described capacitor electrically connected between the drain pad group and the feedback resistor. In many cases, a gate bias is a negative voltage, and when a metal of the metal-containing adhesive such as silver paste which fixes the dielectric substrate and the base is ionized by moisture, metal ions move toward a negative potential wiring on the dielectric substrate. This is called ion migration. When the input-side capacitor and the output-side capacitor are provided as described above, the bias is cut off between these capacitors, and the potential becomes indefinite. Therefore, the ion migration can be curbed.

In the above-described amplifier device, the metal-containing adhesive may be a sintered metal paste.

In the above-described amplifier device, the semiconductor chip may further include a first auxiliary pad provided on the semiconductor substrate on one side of the gate pad group in the extension direction of the first and second end edges of the semiconductor substrate, and a second auxiliary pad provided on the semiconductor substrate on another side of the gate pad group in the extension direction. Then, the first feedback circuit may be electrically connected to the gate pad group via the first auxiliary pad, and the second feedback circuit may be electrically connected to the gate pad group via the second auxiliary pad. In this case, the first and second feedback circuits can be easily connected to the gate pad group.

In the above-described amplifier device, the feedback resistors of the first and second feedback circuits may be thin film resistors formed on a main surface of the dielectric substrate. In this case, the feedback resistors can be easily realized.

In the above-described amplifier device, the dielectric substrate may be thicker than the semiconductor substrate. In this case, a parasitic capacitance generated between the wiring of the feedback circuit on the dielectric substrate and the base can be curbed to a small value.

In the above-described amplifier device, the feedback resistors of the first and second feedback circuits may have a plurality of bonding pads arranged in the extension direction of the feedback resistors. In this case, the resistance value of the feedback resistor can be easily adjusted to an arbitrary value by short-circuiting between arbitrary bonding pads using a bonding wire.

In the above-described amplifier device, a side wall of the package may include a front wall portion and a rear wall portion which face each other in a direction intersecting the extension direction of the first and second end edges of the semiconductor substrate, the input lead may extend from the inside to the outside of the front wall portion, and the output lead may extend from the inside to the outside of the rear wall portion.

In the above-described amplifier device, the dielectric substrates of the first and second feedback circuits may have a rectangular planar shape of which a transverse direction is the extension direction of the first and second end edges of the semiconductor substrate. In this case, one end of the dielectric substrate can be brought closer to the input lead, and another end of the dielectric substrate can be brought closer to the output lead to shorten bonding wires and to reduce the inductance of the bonding wires.

In the above-described amplifier device, the feedback resistors of the first and second feedback circuits may extend from one end to another end of the dielectric substrate in a longitudinal direction and be bent a plurality of times. In this case, the feedback resistor can be lengthened to further increase the resistance.

In the above-described amplifier device, the dielectric substrates of the first and second feedback circuits may be formed of a ceramic.

In the above-described amplifier device, a capacitance value of the capacitor of the first feedback circuit and a capacitance value of the capacitor of the second feedback circuit may be equal to each other.

DETAILS OF EMBODIMENTS OF THE PRESENT DISCLOSURE

Specific examples of an amplifier device of the present disclosure will be described below with reference to the drawings. The present invention is not limited to these examples. The present invention is indicated by the claims, and it is intended to include all changes within the scope and meaning equivalent to the claims. In the following description, the same components are denoted by the same reference numerals in the description of the drawings, and repeated description thereof will be omitted.

Figure 1:
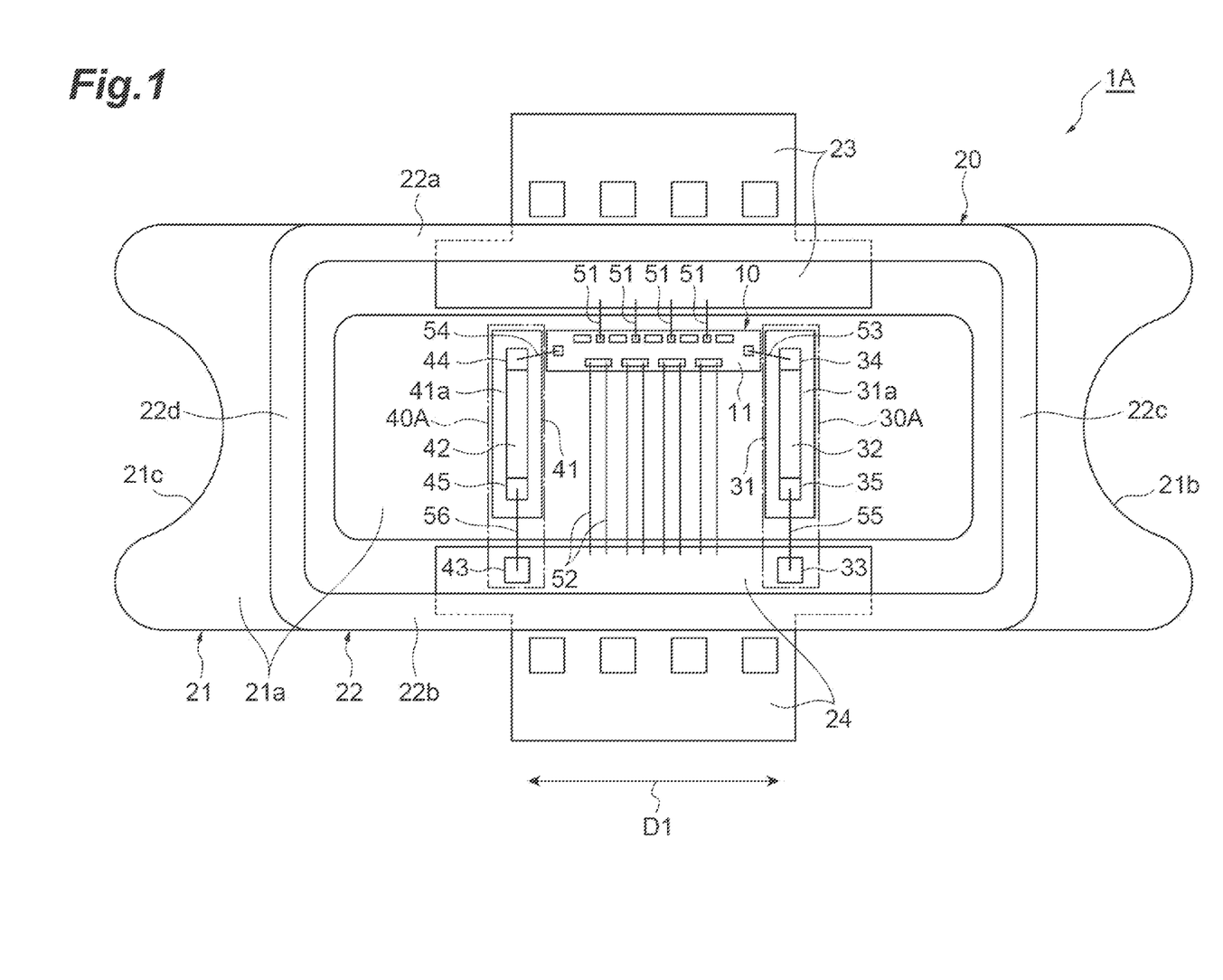
FIG. 1 is a plan view showing a configuration of an amplifier device according to an embodiment of the present disclosure.

FIG. 1 is a plan view showing a configuration of an amplifier device according to an embodiment of the present disclosure. An amplifier device 1A includes a semiconductor chip 10, a package 20, a first feedback circuit 30A, and a second feedback circuit 40A. The semiconductor chip 10 is formed by including a plurality of transistors having a source electrode, a gate electrode, and a drain electrode on a semiconductor substrate. The transistor constituting the semiconductor chip 10 is, for example, an FET having a gate width of 6 mm, and one example is a high electron mobility transistor (HEMT) mainly containing a GaN-based semiconductor. The maximum output of the semiconductor chip 10 is, for example, 30 W.

Figure 2:
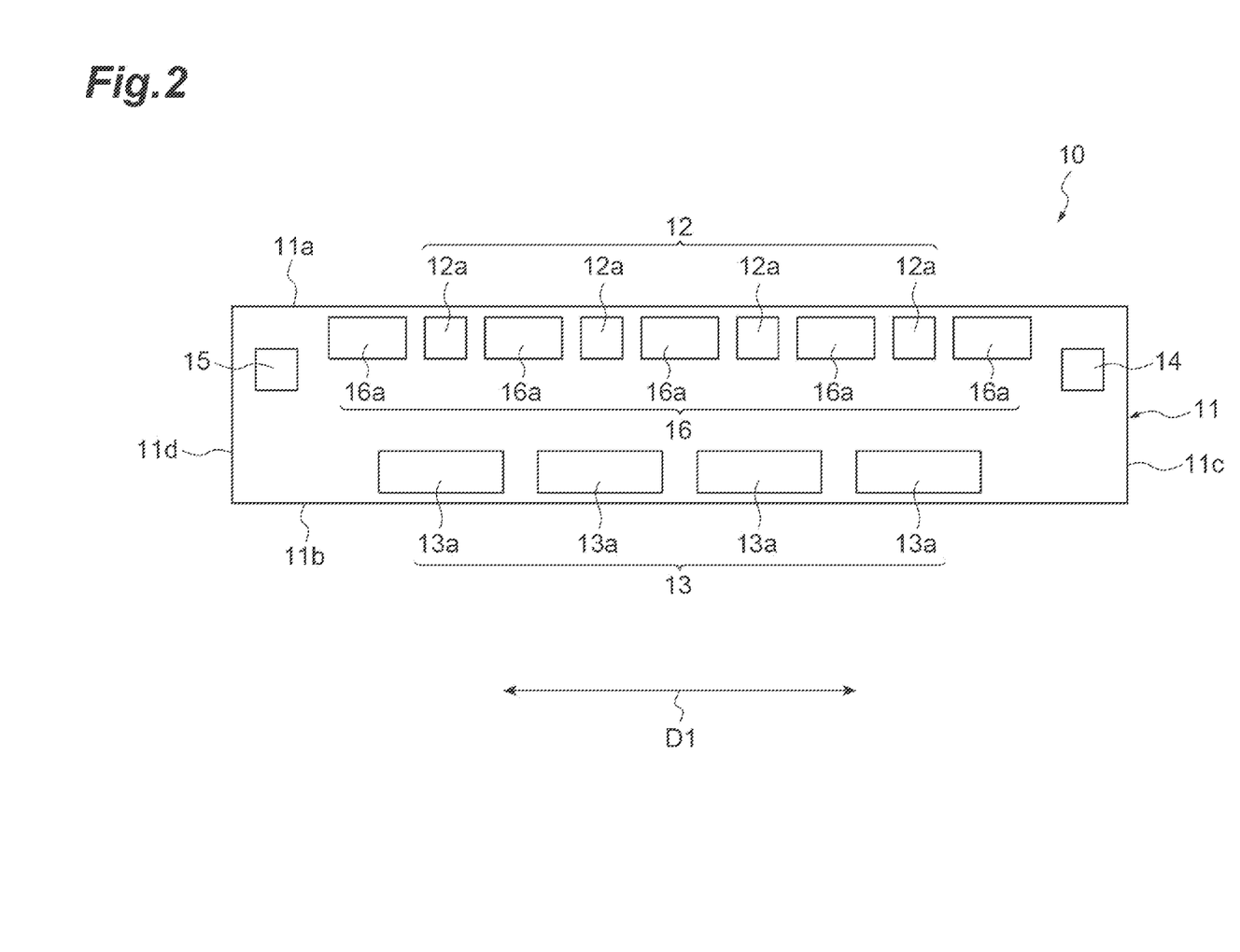
FIG. 2 is an enlarged plan view of a semiconductor chip.

FIG. 2 is an enlarged plan view of the semiconductor chip 10. The semiconductor chip 10 includes a semiconductor substrate 11, and a gate pad group 12, a drain pad group 13, a first auxiliary pad 14, a second auxiliary pad 15, and a source pad group 16 provided on a main surface of the semiconductor substrate 11. The semiconductor substrate 11 has a rectangular planar shape of which a longitudinal direction is a direction D1. The semiconductor substrate 11 has a pair of end edges 11a and 11b which extend in the direction D1 and face each other in a direction intersecting the direction D1. The end edge 11a is an example of a first end edge in the present embodiment. The end edge 11b is an example of a second end edge in the present embodiment. The semiconductor substrate 11 further has a lateral side 11c connecting one side ends of the end edges 11a and 11b and extending in a direction intersecting the direction D1, and a lateral side 11d connecting the other side ends of the end edges 11a and 11b and extending in a direction intersecting the direction D1.

The gate pad group 12 includes a plurality of gate pads 12a connected to the respective gate electrodes of the plurality of transistors. The plurality of gate pads 12a are metal films such as Au films formed on the semiconductor substrate 11. The plurality of gate pads 12a are arranged and disposed on the semiconductor substrate 11 along one of the pair of end edges 11a and 11b, for example, the end edge 11a. Although four gate pads 12a are shown as an example in the drawing, the number of gate pads 12a is any number of 2 or more. Each of the gate pads 12a is electrically connected to one or two or more (for example, six) gate electrodes (not shown), or gate fingers, provided on an active region of the semiconductor substrate 11. As shown in FIG. 1, each of the gate pads 12a is electrically connected to an input lead 23 of the package 20, which will be described later, via a bonding wire 51. A contact width between each of the gate electrodes and the semiconductor, that is, a unit gate width, is, for example, 200 μm.

The drain pad group 13 includes a plurality of drain pads 13a connected to the respective drain electrodes of the plurality of transistors. The plurality of drain pads 13a are metal films such as Au films formed on the semiconductor substrate 11. The plurality of drain pads 13a are arranged and disposed on the semiconductor substrate 11 along the other of the pair of end edges 11a and 11b, for example, the end edge 11b. The number of drain pads 13a is the same as the number of gate pads 12a, for example. Each of the drain pads 13a is electrically connected to two or more drain electrodes (not shown), or drain fingers, provided on the active region of the semiconductor substrate 11. As shown in FIG. 1, each of the drain pads 13a is electrically connected to an output lead 24 of the package 20, which will be described later, via a bonding wire 52.

The auxiliary pad 14 is a metal film such as a Au film formed on the semiconductor substrate 11. The auxiliary pad 14 is provided in a region on the semiconductor substrate 11 on one side of the gate pad group 12 in the direction D1, that is, a region between the gate pad group 12 and the lateral side 11c. The auxiliary pad 14 is electrically connected to some of the gate pads 12a included in the gate pad group 12 through wiring provided on the semiconductor substrate 11. As shown in FIG. 1, the auxiliary pad 14 is electrically connected to the feedback circuit 30A via a bonding wire 53.

The auxiliary pad 15 is a metal film such as a Au film formed on the semiconductor substrate 11. The auxiliary pad 15 is provided in a region on the semiconductor substrate 11 on the other side of the gate pad group 12 in the direction D1, that is, a region between the gate pad group 12 and the lateral side 11d. The auxiliary pad 15 is electrically connected to the remaining gate pads 12a included in the gate pad group 12 through wiring provided on the semiconductor substrate 11. As shown in FIG. 1, the auxiliary pad 15 is electrically connected to the feedback circuit 40A via a bonding wire 54.

The source pad group 16 includes a plurality of source pads 16a connected to the respective source electrodes of the plurality of transistors. The plurality of source pads 16a are metal films such as Au films formed on the semiconductor substrate 11. The plurality of source pads 16a are arranged and disposed on the semiconductor substrate 11 alternately with the gate pads 12a along one of the pair of end edges 11a and 11b, for example, the end edge 11a. Each of the source pads 16a is electrically connected to two or more source electrodes (not shown), or the source fingers, provided on the active region of the semiconductor substrate 11. Each of the source pads 16a is electrically connected to a back electrode film (not shown) of the semiconductor chip 10 via a via which passes through the semiconductor substrate 11.

One or more gate fingers connected to one gate pad 12a, and source fingers and drain fingers which sandwich the gate fingers form one transistor unit. Although FIG. 2 shows the semiconductor chip 10 including four transistor units, the number of transistor units is arbitrary. For example, when the semiconductor chip 10 includes eight transistor units, a total width of the semiconductor chip 10 in the direction D1 which is an arrangement direction of the transistor units is, for example, 6 mm.

FIG. 1 will be referred to again. The package 20 has a base 21, a side wall 22, an input lead 23, and an output lead 24. The base 21 is a metal plate-shaped member. A pair of semicircular recesses 21b and 21c for fixing the amplifier device 1A by screwing are formed at both ends of the base 21 in the direction D1. The base 21 has a flat main surface 21a. A bottom surface of the semiconductor chip 10, that is, the back electrode film, is conductively bonded to a central portion of the main surface 21a in the direction D1 via a metal-containing adhesive. The metal-containing adhesive is, for example, a sintered metal paste, for example, a silver paste. The conductive bonding of the semiconductor chip 10 to the base 21 is performed, for example, by applying a metal paste to the main surface 21a of the base 21, disposing the semiconductor chip 10 on the metal paste, and then volatilizing a resin contained in the metal paste by a heat treatment. In many cases, since the base 21 is defined at a reference potential, or a GND potential, the source electrodes of the semiconductor chip 10 are defined at the reference potential through the back electrode film and the vias.

The side wall 22 is an insulating member which surrounds the semiconductor chip 10. The side wall 22 stands upright on the main surface 21a of the base 21. A planar shape of the side wall 22 of the present embodiment is a substantially rectangular frame shape of which a longitudinal direction is the direction D1. Specifically, the side wall 22 includes a front wall portion 22a, a rear wall portion 22b, a side wall portion 22c, and a side wall portion 22d. The front wall portion 22a and the rear wall portion 22b extend in the direction D1 and face each other in a direction intersecting the direction D1. The side wall portion 22c connects one side ends of the front wall portion 22a and the rear wall portion 22b to each other. The side wall portion 22d connects the other side ends of the front wall portion 22a and the rear wall portion 22b to each other. A distance between the semiconductor chip 10 and the front wall portion 22a is smaller than a distance between the semiconductor chip 10 and the rear wall portion 22b. The side wall 22 is formed of, for example, a ceramic. A covering part (not shown), or a lid, is bonded to an upper surface of the side wall 22, and thus the inside of the side wall 22 is airtightly sealed.

The input lead 23 is a metal plate-shaped member. The input lead 23 passes through the front wall portion 22a and extends from the inside to the outside of the front wall portion 22a. An upper surface of the input lead 23 is exposed from the front wall portion 22a both inside and outside the front wall portion 22a. The upper surface of the input lead 23 inside the front wall portion 22a is electrically connected to the plurality of gate pads 12a via the plurality of bonding wires 51. In one example, one bonding wire 51 is connected to one gate pad 12a. An external wiring of the amplifier device 1A is conductively connected to a portion of the input lead 23 located outside the front wall portion 22a.

The output lead 24 is a metal plate-shaped member which is the same as the input lead 23. The output lead 24 passes through the rear wall portion 22b and extends from the inside to the outside of the rear wall portion 22b. An upper surface of the output lead 24 is exposed from the rear wall portion 22b both inside and outside the rear wall portion 22b. The upper surface of the output lead 24 inside the rear wall portion 22b is electrically connected to the plurality of drain pads 13a via the plurality of bonding wires 52. In one example, two bonding wires 52 are connected to one drain pad 13a. The external wiring of the amplifier device 1A is conductively connected to a portion of the output lead 24 located outside the rear wall portion 22b.

The feedback circuit 30A is disposed in a region on the base 21 on one side of the semiconductor chip 10 in the direction D1. The feedback circuit 30A has a dielectric substrate 31, a feedback resistor 32, and a capacitor 33. The feedback circuit 40A is disposed in a region on the base 21 on the other side of the semiconductor chip 10 in the direction D1. The feedback circuit 40A has a dielectric substrate 41, a feedback resistor 42, and a capacitor 43. One ends of the feedback circuits 30A and 40A are electrically connected to the gate pad group 12 via the respective auxiliary pads 14 and 15. The other ends of the feedback circuits 30A and 40A are electrically connected to the output lead 24.

Figure 3:
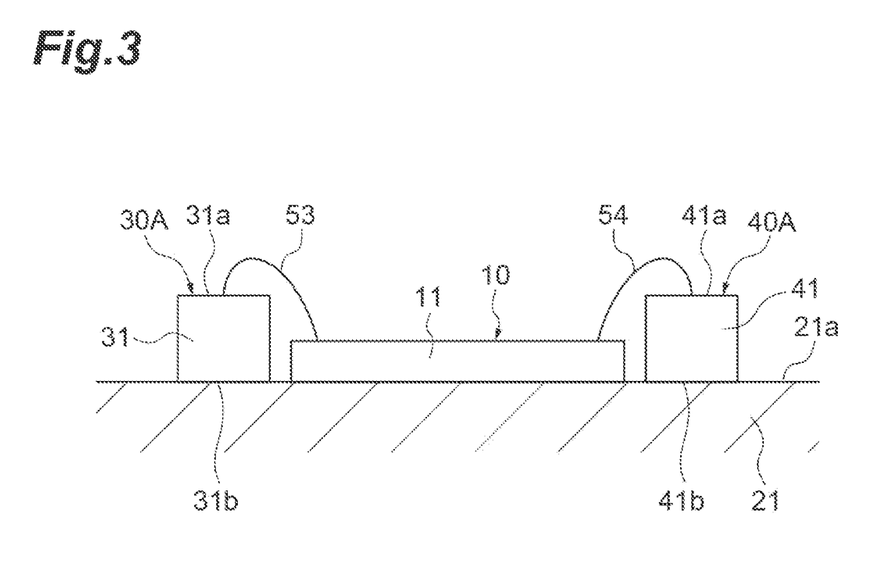
FIG. 3 is a view showing the semiconductor chip and a feedback circuit from a front wall portion.

The dielectric substrates 31 and 41 have a rectangular planar shape of which a transverse direction is the direction D1. The dielectric substrates 31 and 41 are formed of a ceramic such as $Al_2O_3$. FIG. 3 is a view of the semiconductor chip 10 and the feedback circuits 30A and 40A from the front wall portion 22a. As shown in FIG. 3, the dielectric substrates 31 and 41 are thicker than the semiconductor substrate 11. In one example, a thickness of each of the dielectric substrates 31 and 41 is about 250 μm and a thickness of the semiconductor substrate 11 is about 100 μm.

The dielectric substrate 31 has a main surface 31a and a back surface 31b which face each other. Similarly, the dielectric substrate 41 has a main surface 41a and a back surface 41b which face each other. The back surfaces 31b and 41b of the dielectric substrates 31 and 41 face the main surface 21a of the base 21 and are bonded to the main surface 21a via a metal-containing adhesive. The metal-containing adhesive is, for example, a sintered metal paste, for example, a silver paste. A method of bonding the dielectric substrates 31 and 41 to the base 21 is the same as the method of bonding the semiconductor chip 10 to the base 21. That is, the sintered metal paste is applied to the main surface 21a of the base 21, the dielectric substrates 31 and 41 are disposed on the metal paste, and then the resin contained in the metal paste is volatilized by heat treatment. The bonding of the dielectric substrates 31 and 41 to the base 21 may be performed at the same time as the bonding of the semiconductor chip 10 to the base 21.

The feedback resistor 32 is disposed on the dielectric substrate 31 and extends in the longitudinal direction of the dielectric substrate 31. The feedback resistor 32 is, for example, a thin film resistor formed on the main surface 31a of the dielectric substrate 31, and is formed of NiCr in one example. The resistance value of the feedback resistor 32 is, for example, 300Ω. Pads 34 and 35 for wire bonding are provided at both ends of the feedback resistor 32 on the main surface 31a. One end of the bonding wire 53 described above is connected to one pad 34, and the pad 34 is electrically connected to the auxiliary pad 14 via the bonding wire 53. As a result, a DC potential of the feedback resistor 32 is defined by a gate bias. The gate bias is, for example, −2.8 V. The other pad 35 is electrically connected to one electrode of the capacitor 33 via a bonding wire 55.

The feedback resistor 42 is disposed on the dielectric substrate 41 and extends in the longitudinal direction of the dielectric substrate 41. Like the feedback resistor 32, the feedback resistor 42 is, for example, a thin film resistor formed on the main surface 41a of the dielectric substrate 41, and is formed of NiCr in one example. The resistance value of the feedback resistor 42 is equal to, for example, the resistance value of the feedback resistor 32. Pads 44 and 45 for wire bonding are provided at both ends of the feedback resistor 42 on the main surface 41a. One end of the bonding wire 54 described above is connected to one pad 44, and the pad 44 is electrically connected to the auxiliary pad 15 via the bonding wire 54. Thus, a DC potential of the feedback resistor 42 is defined by the gate bias. The other pad 45 is electrically connected to one electrode of the capacitor 43 via a bonding wire 56.

The capacitor 33 is connected in series with the feedback resistor 32 between the output lead 24 inside the side wall 22 and the auxiliary pad 14. The capacitor 33 of the present embodiment is a die capacitor disposed on the output lead 24 inside the side wall 22. An electrode of the pair of electrodes of the capacitor 33 on the side opposite to the electrode connected to the bonding wire 55 is conductively bonded to the output lead 24. Similarly, the capacitor 43 is connected in series with the feedback resistor 42 between the output lead 24 inside the side wall 22 and the auxiliary pad 15. The capacitor 43 of the present embodiment is a die capacitor disposed on the output lead 24 inside the side wall 22. An electrode of the pair of electrodes of the capacitor 43 on the side opposite to the electrode connected to the bonding wire 56 is conductively bonded to the output lead 24. A capacitance value of the capacitor 43 is equal to a capacitance value of the capacitor 33. Each of the capacitance values of the capacitors 33 and 43 has a magnitude which can be regarded as substantially a short circuit in a several GHz band to an LF band, and is, for example, 20 pF.

In the above-described example, one end of each of the feedback circuits 30A and 40A is connected to the gate pad group 12 via each of the auxiliary pads 14 and 15. The present invention is not limited thereto, and one end of each of the feedback circuits 30A and 40A may be directly connected to the gate pad group 12 via a bonding wire or the like without the auxiliary pads 14 and 15. Further, in the above-described example, the other end of each of the feedback circuits 30A and 40A is connected to the drain pad group 13 via the output lead 24. The present invention is not limited thereto, and the other end of each of the feedback circuits 30A and 40A may be directly connected to the drain pad group 13 via a bonding wire or the like without the output lead 24.

Figure 4:
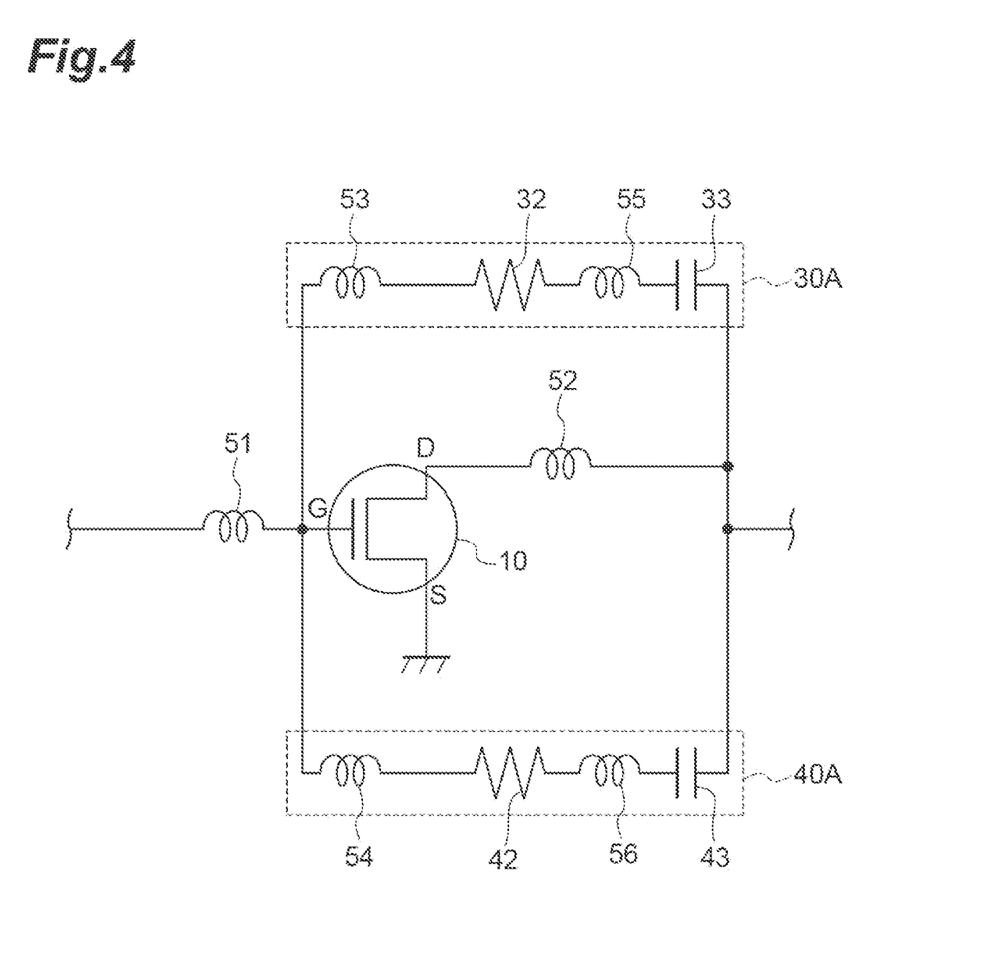
FIG. 4 is a circuit diagram of the amplifier device.

Effects obtained by the amplifier device 1A of the present embodiment described above will be described. FIG. 4 is a circuit diagram of the amplifier device 1A of the present embodiment. In the present embodiment, in order to improve amplification characteristics of the semiconductor chip 10 in a wide frequency band, feedback is performed from the drain to the gate of the semiconductor chip 10 by the feedback circuits 30A and 40A. Since a phase of a signal differs by 180° between the gate and the drain of the semiconductor chip 10, a circuit which performs the feedback from the drain to the gate is a negative feedback circuit. Then, due to a law of a constant gain bandwidth product (GB product), the band is expanded by an amount that the gain is reduced. The feedback depends exclusively on the feedback resistors 32 and 42, and the capacitors 33 and 43 are provided to cut off a DC component. A value which can be regarded as substantially a short circuit in a frequency band on which the feedback acts is set as the capacitance value of the capacitors 33 and 43.

On the other hand, recent high-frequency transistors are required to be capable of handling a larger current. Therefore, a size of the semiconductor chip is gradually increasing, and a semiconductor chip having a large number of gate fingers, for example, several tens, is being put into practical use, as in the present embodiment. In an amplifier device including a semiconductor chip having such a large size, when a feedback circuit is connected between the input lead 23 and the output lead 24 outside the package 20 as in the conventional case, a wiring path of the feedback circuit becomes long, and the inductance of the wiring induces disturbance of the frequency characteristics of the transistor.

In the amplifier device 1A of the present embodiment, in the package 20, the feedback circuits 30A and 40A are provided along with the semiconductor chip 10 on the base 21 on which the semiconductor chip 10 is mounted. Therefore, the wiring path of the feedback circuit can be shortened as compared with a case in which the feedback circuit is provided outside the package 20. Therefore, according to the amplifier device 1A, it is possible to effectively curb the disturbance of the frequency characteristics of each of the transistors included in the semiconductor chip 10.

When the feedback circuit is provided on only one side of the semiconductor chip 10, as the number of gate pads 12a arranged in the direction D1 increases, a distance between each of the gate pads 12a and the feedback circuit varies according to a position of each of the gate pads 12a. Similarly, as the number of drain pads 13a arranged in the direction D1 increases, a distance between each of the drain pads 13a and the feedback circuit varies according to a position of each of the drain pads 13a. The wiring which connects each of the gate pads 12a to the feedback circuit and the wiring which connects each of the drain pads 13a to the feedback circuit have inductances corresponding to their lengths. Therefore, these variations in the distance become variations in feedback effects and cause variations in characteristics of each of the transistors included in the semiconductor chip 10. In particular, in the frequency area which exceeds several GHz, an influence of the inductance of the wiring on the feedback effects becomes large, and the disturbance of the frequency characteristics of the transistor becomes remarkable.

On the other hand, in the present embodiment, the two feedback circuits 30A and 40A are provided, one feedback circuit 30A is provided on one side of the semiconductor chip 10 in the direction D1, and the other feedback circuit 40A is provided on the other side of the semiconductor chip 10 in the direction D1. In this case, as compared with a case in which the feedback circuit is provided on only one side of the semiconductor chip 10, the variation in the distance between the feedback circuit and each of the gate pads 12a and the variation in the distance between the feedback circuit and each of the drain pads 13a are reduced, and it is possible to reduce the variation in the characteristics of each of the transistors due to the variations in the distances.

Further, as compared with the case in which the feedback circuit is provided on only one side of the semiconductor chip 10, since an average length of the wiring which connects the feedback circuit to the semiconductor chip 10 can be shortened, an influence of the inductance of the wiring on the feedback effect can be further reduced.

As described above, the resistance value of the feedback resistor 32 of the feedback circuit 30A and the resistance value of the feedback resistor 42 of the feedback circuit 40A may be equal to each other. In this case, uniform characteristics can be given to the feedback circuits 30A and 40A, and the disturbance of the frequency characteristics of each of the transistors of the semiconductor chip 10 can be more effectively curbed.

As described above, the capacitors 33 and 43 of the feedback circuits 30A and 40A may be die capacitors provided on the output lead 24. In this case, the capacitors 33 and 43 can be easily disposed in the narrow package 20. Further, needs for bonding wires which connect the capacitors 33 and 43 to the output lead 24 are eliminated, and thus the inductance of the wiring can be reduced.

As described above, the semiconductor chip 10 may include the auxiliary pad 14 provided on the semiconductor substrate 11 on one side of the gate pad group 12 in the direction D1, and the auxiliary pads 15 provided on the semiconductor substrate 11 on the other side of the gate pad group 12 in the direction D1. Then, the feedback circuit 30A may be connected to the gate pad group 12 via the auxiliary pad 14, and the feedback circuit 40A may be connected to the gate pad group 12 via the auxiliary pad 15. In this case, the feedback circuits 30A and 40A can be easily connected to the gate pad group 12.

As described above, the feedback resistor 32 of the feedback circuit 30A may be a thin film resistor formed on the main surface 31a of the dielectric substrate 31. Similarly, the feedback resistor 42 of the feedback circuit 40A may be a thin film resistor formed on the main surface 41a of the dielectric substrate 41. In this case, the feedback resistors 32 and 42 can be easily realized.

As described above, the feedback resistor 32 of the feedback circuit 30A may be provided on the dielectric substrate 31. Similarly, the feedback resistor 42 of the feedback circuit 40A may be provided on the dielectric substrate 41. In this case, a parasitic capacitance generated between the wiring of the feedback circuit 30A on the dielectric substrate 31 and the base 21 and a parasitic capacitance generated between the wiring of the feedback circuit 40A on the dielectric substrate 41 and the base 21 are curbed to a small value. In particular, when the dielectric substrates 31 and 41 are thicker than the semiconductor substrate 11, the parasitic capacitances can be curbed more effectively.

First Modified Example

Figure 5:
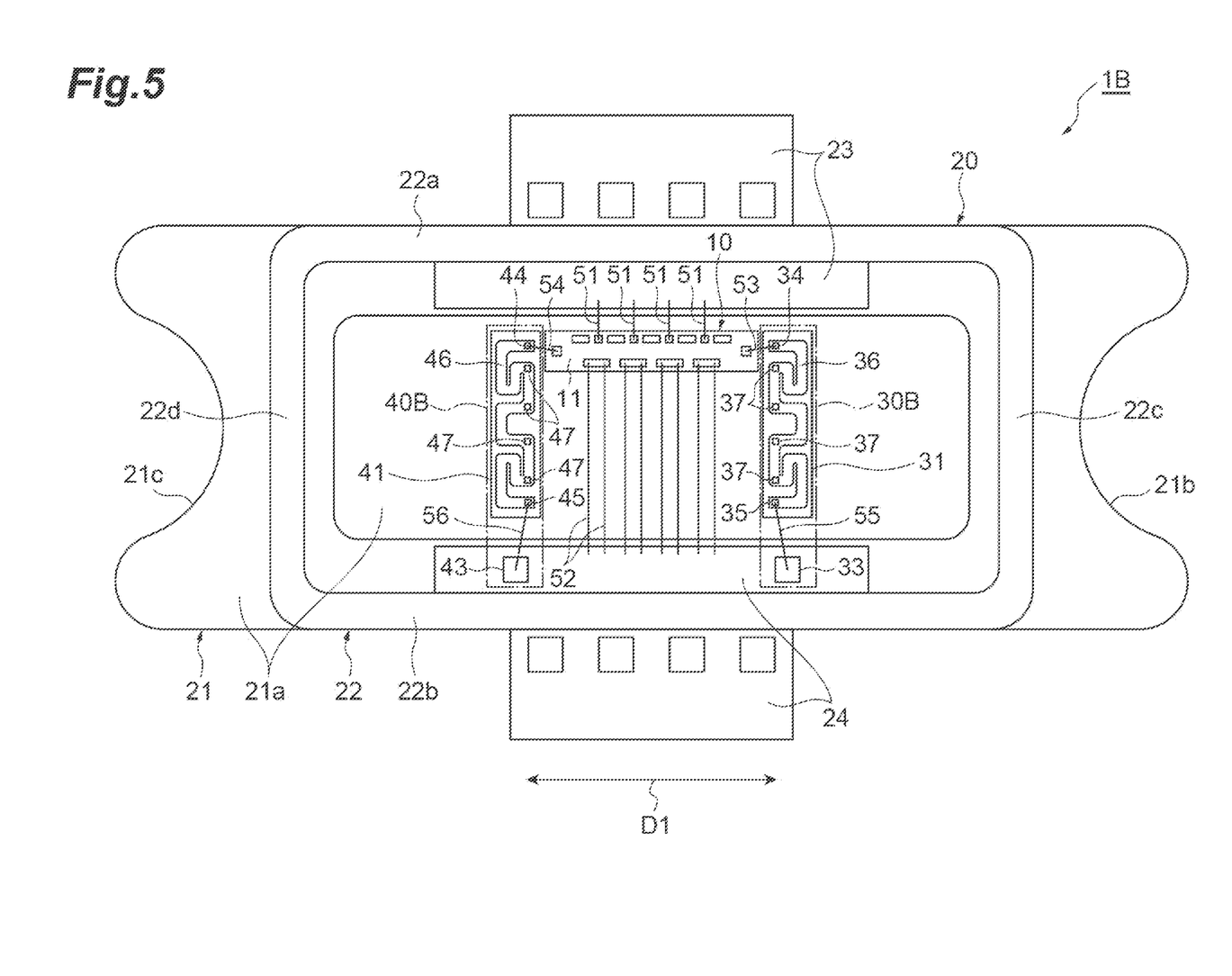
FIG. 5 is a plan view of an amplifier device according to a first modified example.

FIG. 5 is a plan view of an amplifier device 1B according to a first modified example of the above-described embodiment. A difference between the modified example and the above-described embodiment is a configuration and shape of the feedback circuit. Specifically, the amplifier device 1B of the present modified example has feedback circuits 30B and 40B instead of the feedback circuits 30A and 40A of the above-described embodiment. The feedback circuit 30B has a feedback resistor 36 instead of the feedback resistor 32 of the above-described embodiment. The feedback circuit 40B has a feedback resistor 46 instead of the feedback resistor 42 of the above-described embodiment.

As shown in FIG. 5, in the present modified example, the feedback resistors 36 and 46 extend from one end to the other end in the longitudinal direction on the dielectric substrates 31 and 41 while being bent a plurality of times in order to lengthen the feedback resistor to further increase the resistance. Further, a plurality of bonding pads 37 are provided on the feedback resistor 36 to be arranged in an extension direction of the feedback resistor 36. A resistance value of the feedback resistor 36 can be made variable stepwise by short-circuiting any pair of bonding pads 37 by wire bonding. Similarly, a plurality of bonding pads 47 are provided on the feedback resistor 46 to be arranged in the extension direction of the feedback resistor 46. A resistance value of the feedback resistor 46 can be made variable stepwise by short-circuiting any pair of bonding pads 47 by wire bonding. As described above, according to the present modified example, the resistance values of the feedback resistors 36 and 46 can be easily adjusted to have an arbitrary magnitude. Since feedback amounts by the feedback circuits 30B and 40B are inversely proportional to the resistance values of the feedback resistors 36 and 46, the feedback amounts can be easily adjusted. Further, the resistance values of the feedback resistors 36 and 46 can be changed independently of the semiconductor chip 10. Therefore, even when there are variations in the characteristics of the transistors of the semiconductor chip 10 for each of the amplifier devices, it is possible to reduce the variation in the characteristics of the transistors by setting the feedback amount according to the characteristics of the transistors.

Second Modified Example

Figure 6:
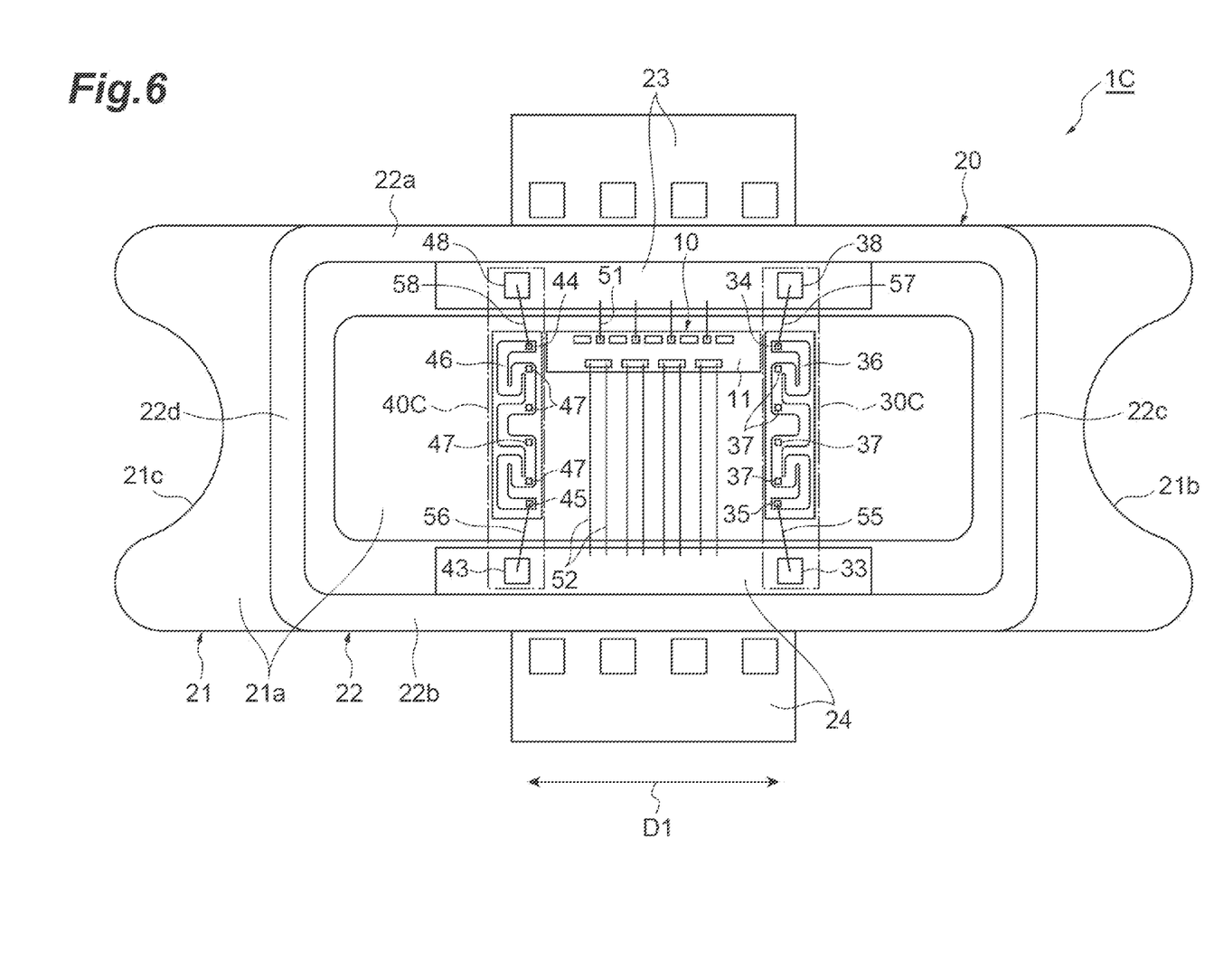
FIG. 6 is a plan view of an amplifier device according to a second modified example.

FIG. 6 is a plan view of an amplifier device 1C according to a second modified example of the above-described embodiment. A difference between the present modified example and the first modified example is a configuration of the feedback circuit. Specifically, the amplifier device 1C of the present modified example has feedback circuits 30C and 40C instead of the feedback circuits 30B and 40B of the first modified example.

The feedback circuit 30C further includes a capacitor 38 in addition to the configuration of the feedback circuit 30B of the first modified example. The capacitor 38 is connected in series with the feedback resistor 36 and the capacitor 33 between the input lead 23 and the output lead 24 inside the side wall 22. The capacitor 38 is a die capacitor disposed on the input lead 23 inside the side wall 22. One electrode of the capacitor 38 is electrically connected to the pad 34 via a bonding wire 57, and the other electrode is conductively bonded to the input lead 23.

Similarly, the feedback circuit 40C further includes a capacitor 48 in addition to the configuration of the feedback circuit 40B of the first modified example. The capacitor 48 is connected in series with the feedback resistor 46 and the capacitor 43 between the input lead 23 and the output lead 24 inside the side wall 22. The capacitor 48 is a die capacitor disposed on the input lead 23 inside the side wall 22. One electrode of the capacitor 48 is electrically connected to the pad 44 via a bonding wire 58, and the other electrode is conductively bonded to the input lead 23. A capacitance value of the capacitor 48 is equal to a capacitance value of the capacitor 38.

The capacitors 38 and 48 correspond to capacitors on the input side in the present modified example. The capacitors 33 and 43 correspond to capacitors on the output side in the present modified example. Although the capacitors 38 and 48 of the present modified example are connected to the input lead 23, the capacitors 38 and 48 may be directly connected to the gate pad group 12 via bonding wires or the like without the input lead 23.

In many cases, the gate bias is a negative voltage. Therefore, when the metal of the metal-containing adhesive such as a silver paste which fixes the dielectric substrates 31 and 41 to the base 21 is ionized by moisture, the metal ions move toward a negative potential wiring on the dielectric substrates 31 and 41. Then, there is a possibility that the wiring on the dielectric substrates 31 and 41 are short-circuited to the base 21 which is the reference potential. Such a phenomenon is called ion migration. When the capacitors 38 and 48 on the input side and the capacitors 33 and 43 on the output side are provided as in the present modified example, the bias is cut off between these capacitors, and the potential becomes indefinite, that is, a float state is established. Therefore, the ion migration can be curbed.

Such measures against the ion migration are effective not only in ceramic packages but also in resin mold packages. In the resin molded packages, since more moisture penetrates into the package than in the ceramic package, it is more effective to cause the DC potential of the wiring on the dielectric substrates 31 and 41 to be in the float state.

The amplifier device according to the present disclosure is not limited to the above-described embodiment, and various other modifications are possible. For example, in the above-described embodiment and each of the modified examples, the capacitors 33 and 43 are mounted on the output leads 24, but the capacitors 33 and 43 may be disposed on the dielectric substrates 31 and 41, respectively. In that case, the capacitors 33 and 43 are connected to the output leads 24 or the drain pad group 13 by bonding wires.

REFERENCE SIGNS LIST 1A, 1B, 1C Amplifier device
10 Semiconductor chip
11 Semiconductor substrate
11a, 11b End edge
11c, 11d lateral side
12 Gate pad group
12a Gate pad
13 Drain pad group
13a Drain pad
14, 15 Auxiliary pad
16 Source pad group
16a Source pad
20 Package
21 Base
21a Main surface
21b, 21c Recess
22 Side wall
22a Front wall portion
22b Rear wall portion
22c, 22d Side wall portion
23 Input lead
24 Output lead
30A, 30B, 30C First feedback circuit
40A, 40B, 40C Second feedback circuit
31, 41 Dielectric substrate
31a, 41a Main surface
31b, 41b Back surface
32, 42 Feedback resistor
33, 43 Capacitor
34, 35, 44, 45 Pad
36, 46 Feedback resistor
37, 47 Bonding pad
38, 48 Capacitor
51 to 58 Bonding wire
D1 Direction

The invention claimed is:

1. An amplifier device comprising:
   a semiconductor chip including a semiconductor substrate with first and second end edges facing each other, a plurality of transistors each having a source electrode, a gate electrode, and a drain electrode on the semiconductor substrate, a gate pad group including a plurality of gate pads disposed on the semiconductor substrate along the first end edge and connected to the respective gate electrodes of the plurality of transistors, a drain pad group including a plurality of drain pads disposed on the semiconductor substrate along the second end edge and connected to the respective drain electrodes of the plurality of transistors, and a source pad group including a plurality of source pads connected to the respective source electrodes of the plurality of transistors;
   a package including a metal base to which a bottom surface of the semiconductor chip is bonded, an insulating side wall configured to surround the semiconductor chip, an input lead connected to the gate pad group and configured to extend from an inside to an outside of the side wall, and an output lead connected to the drain pad group and configured to extend from the inside to the outside of the side wall; and
   first and second feedback circuits each including a dielectric substrate provided on the metal base, a feedback resistor disposed on the dielectric substrate, and a capacitor connected in series with the feedback resistor, and electrically connected between the gate pad group and the drain pad group,
   wherein the first feedback circuit is disposed on the base on one side of the semiconductor chip in an extension direction of the first and second end edges, and
   the second feedback circuit is disposed on the base on another side of the semiconductor chip in the extension direction.

2. The amplifier device according to claim 1, wherein a resistance value of the feedback resistor of the first feedback circuit and a resistance value of the feedback resistor of the second feedback circuit are equal to each other.

3. The amplifier device according to claim 1, wherein the capacitors of the first and second feedback circuits are die capacitors provided on the output leads.

4. The amplifier device according to claim 1, wherein the dielectric substrate is fixed to the base via a metal-containing adhesive, and
   each of the first and second feedback circuits includes an input-side capacitor as the capacitor electrically connected between the gate pad group and the feedback resistor, and an output-side capacitor as the capacitor electrically connected between the drain pad group and the feedback resistor.

5. The amplifier device according to claim 4, wherein the metal-containing adhesive is a sintered metal paste.

6. The amplifier device according to claim 1, wherein the semiconductor chip further includes a first auxiliary pad provided on the semiconductor substrate on one side of the gate pad group in the extension direction of the first and second end edges, and a second auxiliary pad provided on the semiconductor substrate on another side of the gate pad group in the extension direction, and
   the first feedback circuit is electrically connected to the gate pad group via the first auxiliary pad, and the second feedback circuit is electrically connected to the gate pad group via the second auxiliary pad.

7. The amplifier device according to claim 1, wherein the feedback resistors of the first and second feedback circuits are thin film resistors formed on a main surface of the dielectric substrate.

8. The amplifier device according to claim 1, wherein the dielectric substrate is thicker than the semiconductor substrate.

9. The amplifier device according to claim 1, wherein the feedback resistors of the first and second feedback circuits have a plurality of bonding pads arranged in an extension direction of the feedback resistors.

10. The amplifier device according to claim 1, wherein the side wall of the package includes a front wall portion and a rear wall portion which face each other in a direction intersecting the extension direction of the first and second end edges, the input lead extends from an inside to an outside of the front wall portion, and the output lead extends from an inside to an outside of the rear wall portion.

11. The amplifier device according to claim 1, wherein the dielectric substrate of each of the first and second feedback circuits has a rectangular planar shape of which a transverse direction is the extension direction of the first and second end edges.

12. The amplifier device according to claim 11, wherein the feedback resistors of the first and second feedback circuits extend from one end to another end of the dielectric substrate in a longitudinal direction and are bent a plurality of times.

13. The amplifier device according to claim 1, wherein the dielectric substrates of the first and second feedback circuits are formed of a ceramic.

14. The amplifier device according to claim 1, wherein a capacitance value of the capacitor in the first feedback circuit and a capacitance value of the capacitor in the second feedback circuit are equal to each other.

* * * * *